United States Patent
Liao

(10) Patent No.: US 7,651,358 B2
(45) Date of Patent: Jan. 26, 2010

(54) PIN GRID ARRAY SOCKET HAVING A BASE WITH INTERIOR STANDOFFS AND HIGHTENING PERIPHERAL WALLS

(75) Inventor: Fang-Chu Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/157,906

(22) Filed: Jun. 13, 2008

(65) Prior Publication Data

US 2008/0311777 A1    Dec. 18, 2008

(30) Foreign Application Priority Data

Jun. 13, 2007    (CN)    ............ 2007 2 0039617

(51) Int. Cl.
*H01R 43/00* (2006.01)
(52) U.S. Cl. .................................... 439/342
(58) Field of Classification Search ............ 439/342, 439/330, 331, 296, 299; 174/250; 29/883
See application file for complete search history.

(56) References Cited

U.S. PATENT DOCUMENTS

| | | | |
|---|---|---|---|
| 6,340,309 B1 | 1/2002 | Lin et al. | |
| 7,010,858 B2 * | 3/2006 | Turner et al. | 29/883 |
| 2008/0160806 A1 * | 7/2008 | Ma | 439/153 |

* cited by examiner

*Primary Examiner*—Alexander Gilman
(74) *Attorney, Agent, or Firm*—Andrew C. Cheng; Wei Te Chung; Ming Chieh Chang

(57) ABSTRACT

A socket connector is provided for securely mounting an electronic device (1000) on a printed circuit board, said socket connector comprises an insulatve base (60) and heightened perimeter walls (606) upward extending therefrom to define an inner cavity. The top surface (602) of the inner cavity comprises a plural of passageways (608) in which a plural of contacts (70) hold. Furthermore, there are a plural of standoffs (610) between the adjacent passageways (608) co-worked with the heightened perimeter walls (606) for effectively preventing a cover (90) from deformation.

7 Claims, 5 Drawing Sheets

PIN GRID ARRAY SOCKET HAVING A BASE WITH INTERIOR STANDOFFS AND HIGHTENING PERIPHERAL WALLS

BACKGROUND OF THE INVENTION

1. Field of the Invention

The present invention generally relates to an electrical socket connector, and more particularly to a Pin Grid Array (PGA) socket having a base with a plurality of standoffs extending upward from a top surface thereof so as to provide addition space for contact engaging arms of contact terminals assembled therein.

2. Description of Related Art

U.S. Pat. No. 6,340,309 issued to Lin on Jan. 22, 2002, as shown in FIG. 1, discloses a pin grid array (PGA) socket 10 on which a CPU 20 is mounted. The CPU 20 has a plurality of pins 21 extending through a cover 11 into a dielectric base 12 of the socket for electrically engaging with contacts 110 received in the base. The cover 11 of the PGA socket 10 comprises a main body 115 and a raised portion 112 in front of the main body 115. The raised portion 112 defines an elliptic aperture 113 in middle thereof. Two opposite side walls 116 of the cover 11 are extended downwardly from two opposite edges of the main body 115, respectively. The main body 115 also defines a plurality of passageways 114 (only four shown) therein and a rectangular opening 111 in a center thereof.

The dielectric base 12 comprises four standoffs 126 on four corners of a bottom thereof. A circular hole 123 corresponding to the aperture 113 of the cover 11 is defined in a front portion of the dielectric base 12 and communicates with an L-shaped groove 124 defined in rear of the aperture 113. A plural of apertures 122 to which are correspondent the passageways 114 and used for receiving corresponding contacts 110 therein. The dielectric base 12 also defines a rectangular opening 125 in a center thereof, which is correspondent to the rectangular opening 111. A pair of elongate blocks 1211 is formed at each of two opposite side edges 121 of the base 12. A driver 13 is received in the circular hole 123 and the elliptic aperture 113. A resilient tab 131 is received in the L-shaped groove 124.

In assembly, the cover 11 is mounted to the dielectric base 12 with the elongate blocks 1211 being movably received in the grooves 1111 thereby slideably mounting the cover 11 on the base 12. The elliptic aperture 113 of the cover 11 communicates with the circular hole 123 of the dielectric base 12 for receiving the driver 13 therein with the resilient tab 131 of the driver 13 received in the L-shaped groove 124 of the dielectric base 12. By rotating the driver 13, the cover 11 moves relative to the dielectric base 12 between open and closed positions. The CPU 20 is mounted to the PGA socket 10 when the driver 13 is rotated to move the cover 11 to the open position, in which pins 21 (only three shown) of the CPU 20 are inserted into corresponding apertures 122 of the base 12 through the passageways 114 of the cover 11. When the driver 13 is rotated to move the cover 11 to the closed position, the pins 21 are moved following the movement of the cover 11 to have an electrical engagement with the contacts 110. Furthermore, in the middle of the opposite sides of the cover 90 further comprise right-angle steps 1112 adapted for easily removing the CPU 20 by the user.

As the sharply growing numbers of pins of an CPU and corresponding passageways in which contacts secure, there is a possibility that the lead pins will interfere with the cavity walls during insertion and horizontal movement of the lead pins. Therefore it is necessary to occupy a certain sized space for the cavities. Accordingly it is difficult to achieve a socket connector with high-density contacts restrained in narrow pitches due to these dimensional constraints.

Under such situation, there is a need to offer an improved socket connector having insulative base with passageways thereon. Not only the passageways are able to effectively hold contacts therein, but offer an extra space for freely movement of the pins not limited by the size of the passageways. In order to achieve foregoing request, the lead pin contact portions are defined out of the passageways. However, the lead pin contact portions are deformed directly by a cover due to substantial supporting means. Therefore, A socket connector with substantial supporting means on a top surface the base is provided herein.

BRIEF SUMMARY OF THE INVENTION

An object of the present invention is to provide a socket connector with resilient contact portions over the upper surface of apertures in an insulateive base able to effective prevent contacts and pins from deformation resulted from a sunk cover during the period of mounting a CPU or taking by a user.

A socket connector according to the invention features comprises an insulative housing having a base and perimeter walls upwardly extending from a bottom surface of the base and over than a upper surface thereof to define a cavity, the cavity comprising a interior area having a plural of apertures in which a plural of contacts hold, each of the contacts comprising a pair of narrowly spaced resilient contact portion for receiving lead pins of another electrical device, which is higher than an upper surface of the base. Beside that, the socket connector further comprise a driving mechanism for moving the lead pins in a direction perpendicular to an insertion direction thereof for sliding a plural of passageways of a cover to connect lead pins of a electrical device with the resilient contact portion. At least one supporting element positioned on the upper surface of the base to offer a proper supporting force for preventing the cover from deformation.

A method for assembling an IC package in a socket connector with regard to the present invention comprising the steps of: (a) providing a insulative base and perimeter walls upwardly extending therefrom higher than the upper surface of the base to define a cavity, the cavity comprising an interior area with a plural of apertures; (b) inserting a plural of contacts into the plural of apertures, each of the contact comprising a pair of narrowly spaced resilient contact portion for receiving lead pins of another electrical device, which is higher than an upper surface of the base; (c) clamping the base with a cover having a plural of passageways through which lead pins of a electrical device pass; (d) aligning the lead pins of the electrical device to pass through the corresponding passageways of the cover; (e) moving the cover laterally controlled by a driving mechanism such that each of the lead pins moving laterally and contacting with the corresponding resilient contact portion.

Other objects, advantages and novel features of the invention will become more apparent from the following detailed description of the present embodiment when taken in conjunction with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE INVENTION

Figure 1:
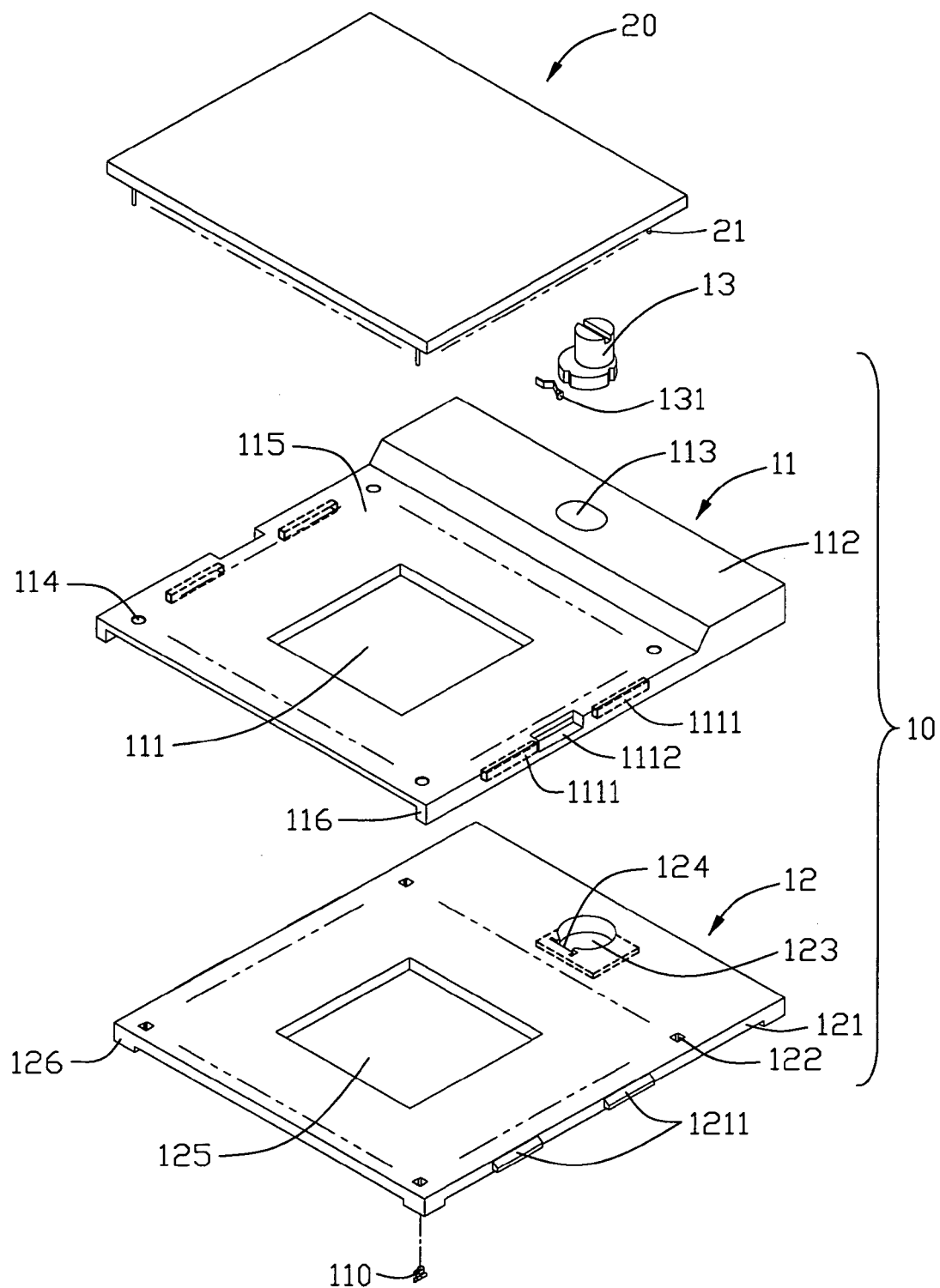
FIG. 1 illustrates a decomposed view of a conventional ZIF socket connector and a CPU.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
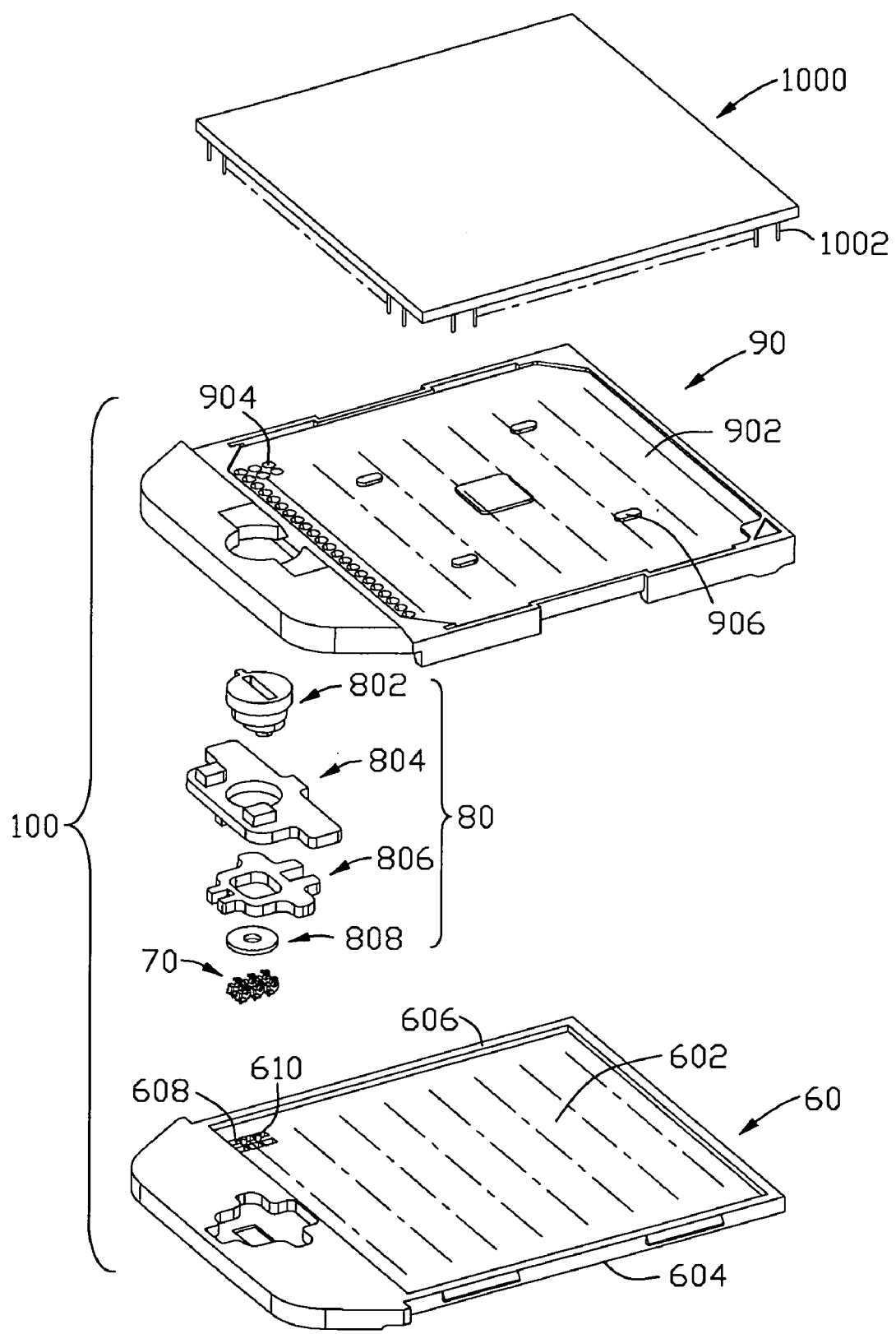
FIG. 2 illustrates a decomposed view of a socket connector according to the preferred embodiment of the present invention.
Figure 3:
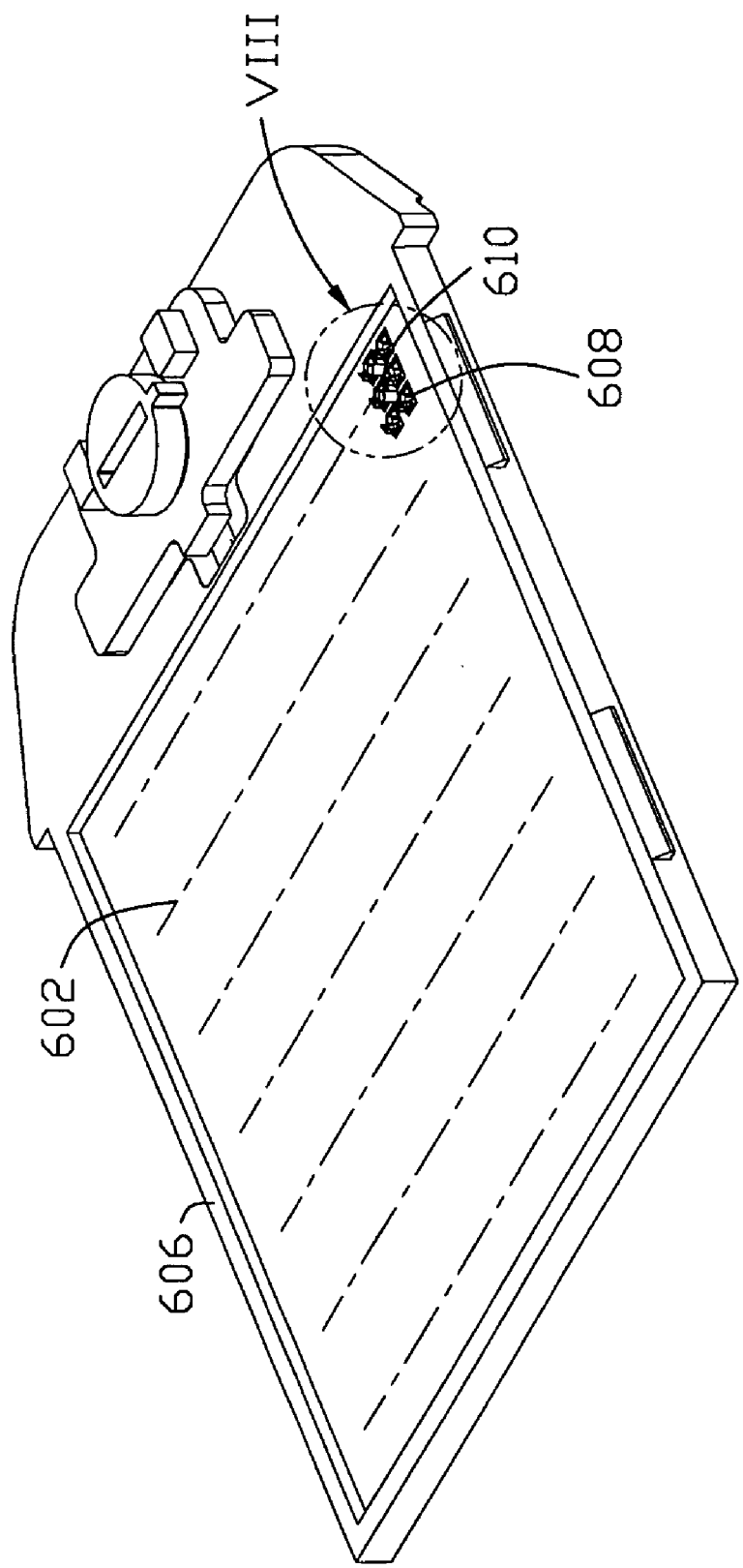
FIG. 3 illustrates a base configured in a socket connector according to the preferred embodiment of the present invention.
Figure 4:
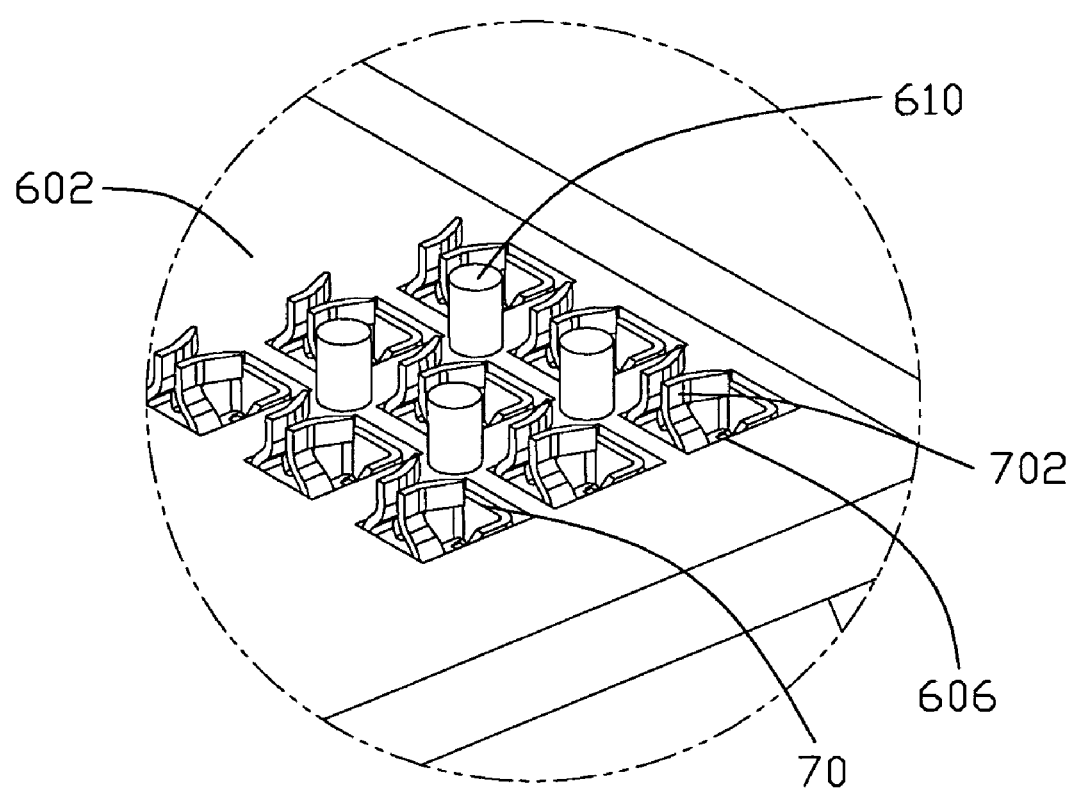
FIG. 4 illustrates an enlarged view of the localized area IV of FIG. 3.
Figure 5:
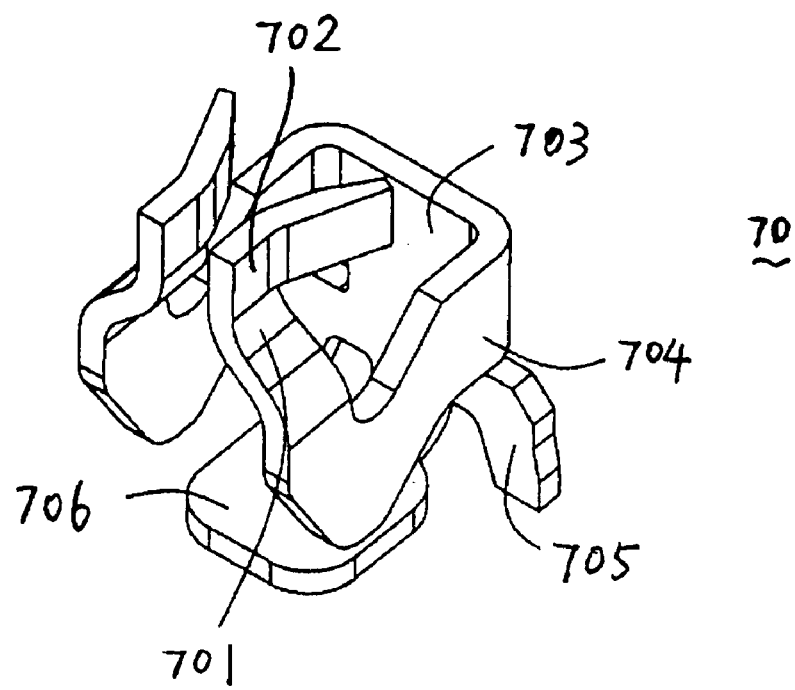
FIG. 5 illustrates the contact used in the connector of FIG. 4.
Figure 6:
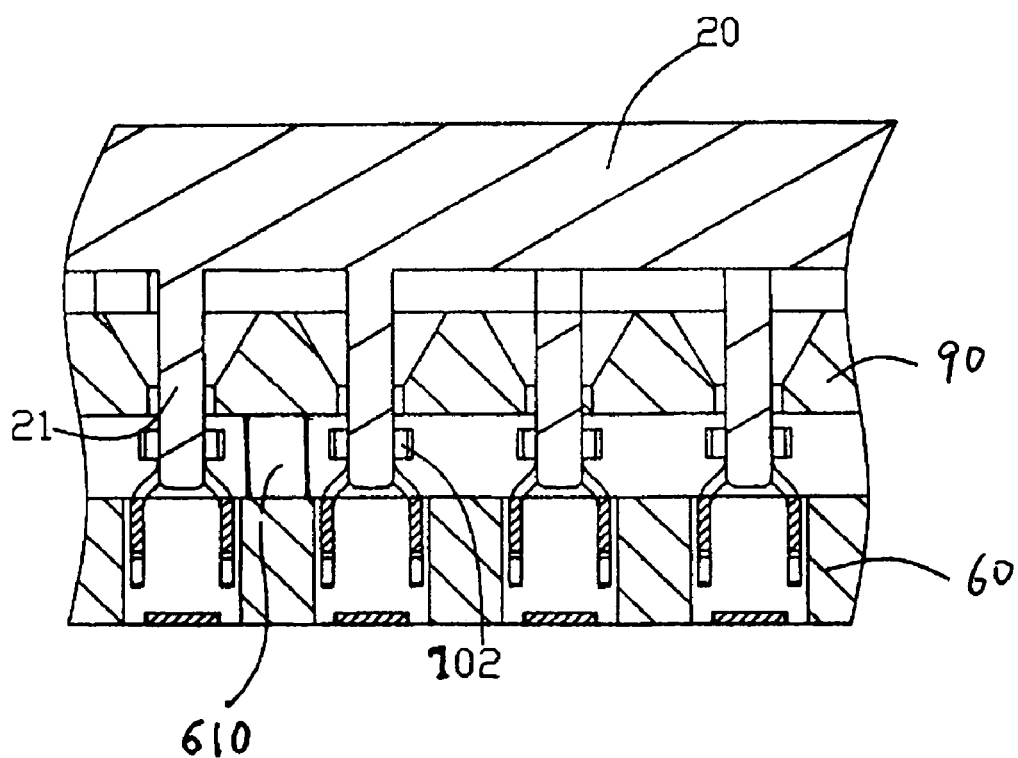
FIG. 6 shows a cross-sectional view of an assembly of the connector and the corresponding electronic device of FIG. 2.

The preferred embodiment of the PGA Type socket connector (hereinafter, referred to as "socket connector") of the present invention will describe in detail with reference to the attached drawing. Referring to FIGS. 2-6, the major component of the socket connector includes a base 60, a plural of contacts 70, a screw cam 80, and a cover 90. The base 60 has a top surface 602 and mounting surface 604 and a plurality of opposing peripheral walls 606 extending upward from the sides of the base 60 to define a cavity. The cavity comprising an interior area having a plural of passageways 608 in which a plural of contacts 70 held therein. Each contact 70 includes a solder pad 706, a retention section 705, an abutment wall 703, a pair of parallel arms 704 extending from the abutment wall 703, a pair of upwardly converging arms 701 extending from the parallel arms 704, and the contact portions 702 located atop the converging arms 701. More importantly, the plurality of opposing peripheral walls 606 are heightened a specified height for sustaining the pressure from a electronic device 1000 or a user via the cover 90. In the preferred embodiment, the screw cam 80 is composed of cam 802, cover plate 804, base plate 806, and base ring 808. It should be recognized by the man skilled in the art that the screw cam might be replaced by a lever as a driving mechanism for laterally sliding the cover 90 relative to the base 60. The top surface 902 of the cover 90 has a plural of apertures 904 through which pins 1002 of an electronic device 1000 pass and a plural of raised block 906 adapted for supporting the electronic device 1000.

There are a plural of supporting element 610 between adjacent apertures in which a plural of contacts hold. The supporting element 610 may be any shape, for example the shape of column, block, post, bump or prism, further co-worked with heightened perimeter walls 634 for preventing the cover 90 from deformation. As a result, the possibility of warping the lead pin contact portions 702 of contacts 70 is able to effectively reduce.

Although the present invention has been illustrated and described with respect to exemplary embodiment thereof, it should be understood by those skilled in the art that the various changes, omissions and additions may be made therein and thereto without departing from the spirit and scope of the present invention as set forth in the appended claims.

What is claimed is:

1. A socket connector for receiving an electronic device, comprising:
    a base having a top surface and a mounting surface, a plurality of passageways extending therebetween, peripheral walls extending upward from sides of the base and higher than the top surface thereof with a specific height to define a cavity; an interior area of the cavity comprising a plural of standoffs between the plural of passageways in which a plural of contacts held therein;
    a cover moveably assembled to the base and supported by the peripheral walls and the standoffs, the cover having a plurality of through holes corresponding to the passageways, respectively; and
    a driving mechanism disposed on the base to drive the cover from a first position, in which receives lead pins of an electronic device, to a second position, in which moves the lead pins in a direction perpendicular to an insertion direction of the lead pins for engaging with the contacts;
    wherein the through holes of the cover are uprightly overlapping both with the passageways and walls of the passageways when the cover is in the first position.

2. A socket connector as claimed in claim 1, wherein each of the contacts having a pair of narrowly spaced resilient contact portion for receiving lead pins of an electrical device, which is higher than the top surface of the base.

3. A socket connector as claimed in claim 1, wherein the contacts extend upwardly out of the passageways and the lead pins of the electronic device do not insert into the passageways when the electronic device is full loaded upon the cover.

4. An electrical connector comprising:
    an insulative housing including a base with opposite upper and bottom faces thereon;
    a plurality of passageways extending through the base and between the upper and bottom faces;
    the housing further including a cover mounted upon the base and moveable along a front-to-back direction relative to the base, said cover defining a plurality of through holes essentially aligned with the corresponding passageways, respectively; and
    a plurality of contacts retainably disposed in the corresponding passageways and, respectively, each of said contacts defining a contacting section essentially extending out of the passageway and located above the upper face;
    wherein a bottom surface of the cover is essentially spaced from the upper face of the base with a gap where the contacting sections are disposed, and at least one of said upper face of the base and the bottom surface of the cover is equipped with a plurality of discrete supporting elements among said contacting sections to abut against the other of said upper face of the base and the bottom surface of the cover so as to prevent downward bending around a center portion of the cover when an IC package is loaded upon a top surface of the cover with a plurality of pins extending through the corresponding through holes to engage the contacting sections of corresponding contact via horizontal movement of the cover relative to the base;
    wherein the gap is dimensioned to be large enough to prevent said pins of the IC package from entering the corresponding passageways and from being restrained within the corresponding passageways during said horizontal movement of the cover relative to the base.

5. The connector as claimed in claim 4, wherein the supporting members are formed on the base.

6. The connector as claimed in claim 5, wherein said supporting members are essentially located at intersection areas with regard to the passageways for not blocking heat transfer.

7. The connector as claimed in claim 6, wherein not all passageways are equipped with the corresponding supporting members thereabouts.

* * * * *